(12) United States Patent
Yoshikawa et al.

(10) Patent No.: US 7,751,459 B2
(45) Date of Patent: Jul. 6, 2010

(54) VERTICAL-CAVITY SURFACE-EMITTING LASER, MODULE, OPTICAL TRANSMISSION DEVICE, FREE SPACE OPTICAL COMMUNICATION DEVICE, OPTICAL TRANSMISSION SYSTEM, AND FREE SPACE OPTICAL COMMUNICATION SYSTEM

(75) Inventors: Masahiro Yoshikawa, Kanagawa (JP); Masateru Yamamoto, Kanagawa (JP); Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/330,118

(22) Filed: Dec. 8, 2008

(65) Prior Publication Data
US 2009/0201963 A1 Aug. 13, 2009

(30) Foreign Application Priority Data
Feb. 13, 2008 (JP) ............................. 2008-032251

(51) Int. Cl.
*H01S 5/00* (2006.01)
(52) U.S. Cl. .................. 372/50.124; 372/50.11
(58) Field of Classification Search ............. 372/50.11, 372/50.124
See application file for complete search history.

(56) References Cited

FOREIGN PATENT DOCUMENTS

| JP | 2000-164982 | 6/2000 |
|----|-------------|--------|
| JP | 2001-094208 | 4/2001 |
| JP | 2004-128482 | 4/2004 |
| JP | 2007-294787 | 11/2007 |
| JP | 2008-027949 | 2/2008 |

*Primary Examiner*—Armando Rodriguez
(74) *Attorney, Agent, or Firm*—Fildes & Outland, P.C.

(57) ABSTRACT

Provided is a VCSEL that includes: a first semiconductor multilayer film reflective mirror of a first conductivity type formed on a substrate; an active region formed thereon; a current confining layer of a second conductivity type formed thereon; a second semiconductor multilayer film reflective mirror of the second conductivity type formed thereon; and a third semiconductor multilayer film reflective mirror of the second conductivity type formed thereon. The reflective mirrors include a pair of a high refractive index layer and a low refractive index layer. The impurity concentration of the second reflective mirror is higher than that of the third reflective mirror. The band gap energy of the high refractive index layer in the second reflective mirror is greater than the energy of the wavelength of a resonator formed of the first reflective mirror, the active region, the current confining layer, the second reflective mirror, and the third reflective mirror.

13 Claims, 8 Drawing Sheets

Cross sectional view of line A-A

Cross sectional view of line A-A

US 7,751,459 B2

VERTICAL-CAVITY SURFACE-EMITTING LASER, MODULE, OPTICAL TRANSMISSION DEVICE, FREE SPACE OPTICAL COMMUNICATION DEVICE, OPTICAL TRANSMISSION SYSTEM, AND FREE SPACE OPTICAL COMMUNICATION SYSTEM

CROSS-REFERENCE TO RELATED APPLICATION

This application is based on and claims priority under 35 USC 119 from Japanese Patent Application No. 2008-032251 filed Feb. 13, 2008.

BACKGROUND

1. Technical Field

This invention relates to a Vertical-Cavity Surface-Emitting Laser (hereinafter referred to as VCSEL) used as a light source for optical data processing or high-speed optical transmission. This invention also relates to a module, an optical transmission device, a free space optical communication device, an optical transmission system, and a free space optical communication system.

2. Related Art

In recent years, in technical fields such as optical communication or optical storage, there has been a growing interest in VCSELs. VCSELs have excellent characteristics which edge-emitting semiconductor lasers do not have. For example, a VCSEL has a lower threshold current and consumes less power. With VCSELs, a round light spot can be easily obtained, and evaluation can be performed while they are on a wafer, and light sources can be arranged in two-dimensional arrays. With these characteristics, demands for VCSELs as light sources have been expected to grow especially in the communication field.

SUMMARY

An aspect of the present invention provides a VCSEL that includes: a substrate; a first semiconductor multilayer film reflective mirror of a first conductivity type formed on the substrate; an active region formed on the first semiconductor multilayer film reflective mirror; a current confining layer of a second conductivity type formed on the active region; a second semiconductor multilayer film reflective mirror of the second conductivity type formed on the current confining layer; and a third semiconductor multilayer film reflective mirror of the second conductivity type formed on the second semiconductor multilayer film reflective mirror. The first, second, and third semiconductor multilayer film reflective mirrors each include a pair of a high refractive index layer and a low refractive index layer. The impurity concentration of the second semiconductor multilayer film reflective mirror is higher than the impurity concentration of the third semiconductor multilayer film reflective mirror. The band gap energy of the high refractive index layer in the second semiconductor multilayer film reflective mirror is greater than the energy of the wavelength of a resonator formed of the first semiconductor multilayer film reflective mirror, the active region, the current confining layer, the second semiconductor multilayer film reflective mirror, and the third semiconductor multilayer film reflective mirror.

BRIEF DESCRIPTION OF THE DRAWINGS

Exemplary embodiments of the present invention will be described in detail based on the following figures, wherein:

FIG. 8B is used for a free space optical transmission device;

DETAILED DESCRIPTION

Referring to the accompanying drawings, exemplary embodiments for implementing the present invention will be now described. In the specification, an AlGaAs semiconductor layer and a GaAs substrate are used as examples of a III-V group compound semiconductor. An illustrated VCSEL has a configuration in which an n-side electrode is formed on a back surface of the substrate, and laser light is emitted from above the substrate.

Figure 1:
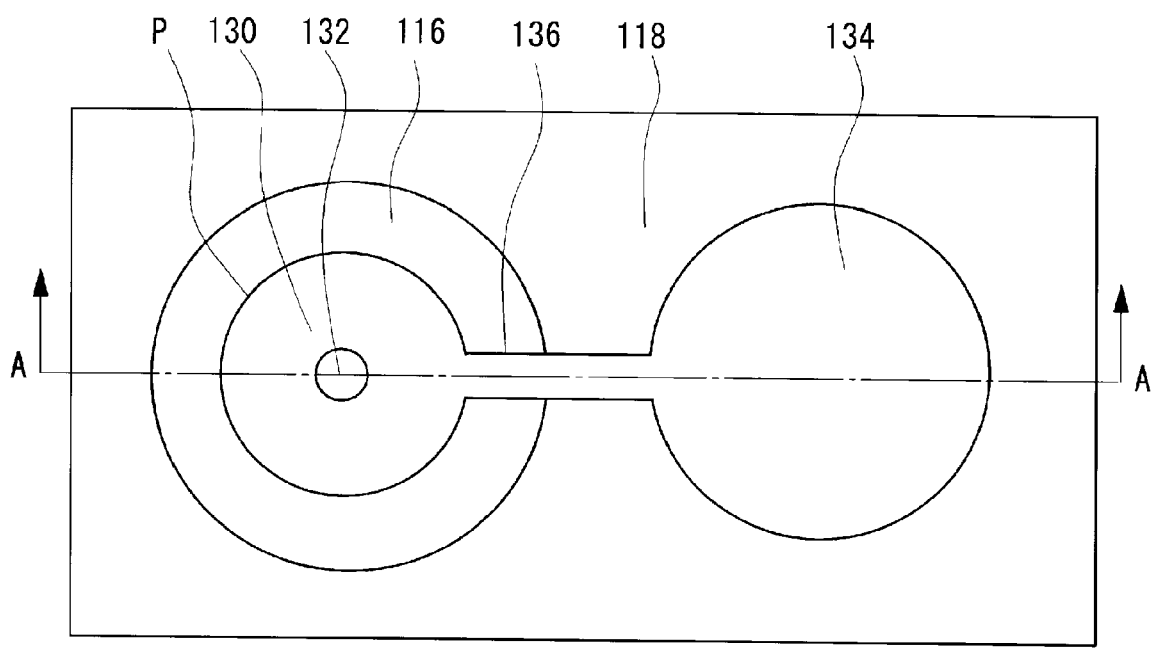
FIG. 1 is a schematic plan view of a VCSEL according to an example of the present invention.
Figure 2:
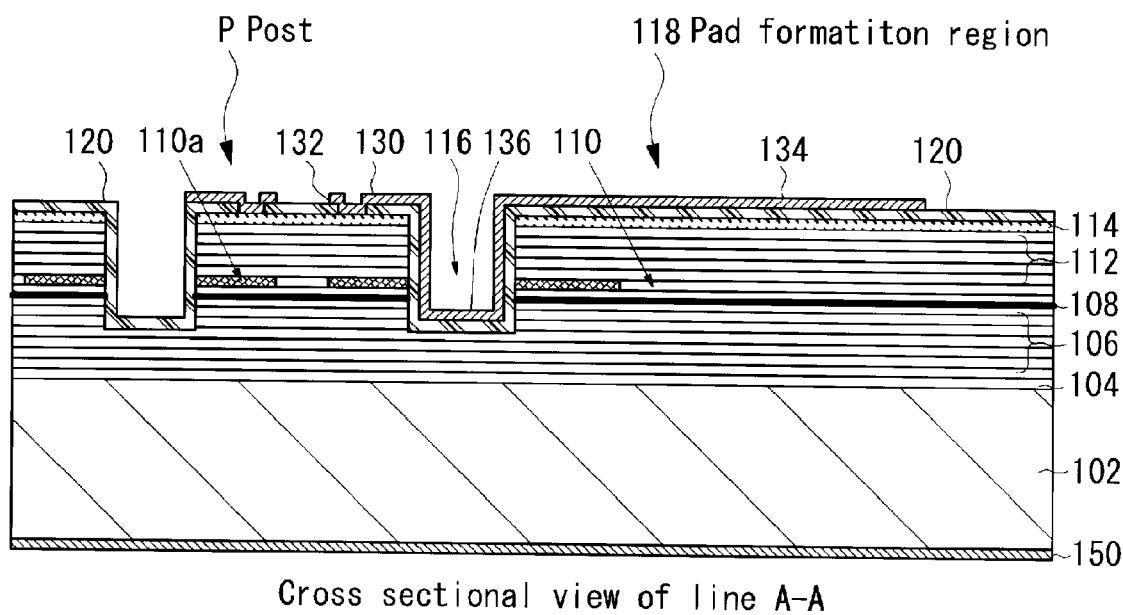
FIG. 2 is a cross sectional view taken along line A-A of FIG. 1.

FIG. 1 is a plan view of a VCSEL according to an example of the present invention. FIG. 2 is a cross sectional view taken along line A-A of FIG. 1. As shown in FIG. 1 and FIG. 2, a VCSEL 100 may include an n-side electrode 150 on a back surface of an n-type GaAs substrate 102. Stacked on the substrate 102 may be semiconductor layers including an n-type GaAs buffer layer 104, a lower Distributed Bragg Reflector (DBR) 106 made of n-type AlGaAs semiconductor multilayer films, an active region 108, a current confining layer 110 made of p-type AlAs, an upper DBR 112 made of p-type AlGaAs semiconductor multilayer films, a p-type GaAs contact layer 114.

To the substrate 102, a ring-shaped groove 116 may be formed by etching the semiconductor layers such that the groove 116 has a depth starting from the contact layer 114 to a portion of the lower DBR 106. By the groove 116, a cylindrical post (mesa) P that becomes a laser light emitting portion may be defined, and a pad formation region 118 may be formed isolated from the post P. The post P functions as a resonator structure made of the lower DBR 106 and the upper DBR 112, and therebetween, the active region 108 and the current confining layer 110 are interposed. The current confining layer 110 includes an oxidized region 110a formed by selectively oxidizing outer periphery of the AlAs exposed at a side surface of the post P and a conductive region surrounded by the oxidized region, and confines current and light in the conductive region. The conductive region in a plan view may be a round shape that reflects the outline of the post P.

On the entire surface of the substrate including the groove 116, an interlayer insulating film 120 may be formed. In other words, the interlayer insulating film 120 may cover a portion of top of the post P, the groove 116, and a side surface of the pad formation region 118. At a top portion of the post P, an annular contact hole may be formed in the interlayer insulating film 120. Through the contact hole, a p-side round-shaped upper electrode 130 may be electrically coupled to the contact layer 114. The p-side upper electrode 130 may be made of gold or titanium/gold, and at a center portion thereof, a round-shaped opening 132 that defines a laser light emitting region may be formed. In the example of FIG. 2, the opening 132 is blocked by the interlayer insulating film 120 and protected such that the GaAs contact layer 114 is not exposed to the outside. However, the opening 132 is not necessarily blocked by the interlayer insulating film 120, and may be exposed.

In the pad formation region 118, a round-shaped electrode pad 134 may be formed on the interlayer insulating film 120. The electrode pad 134 may be connected to the p-side upper electrode 130 via an extraction electrode wiring 136 that extends in the groove 116.

Figure 3:
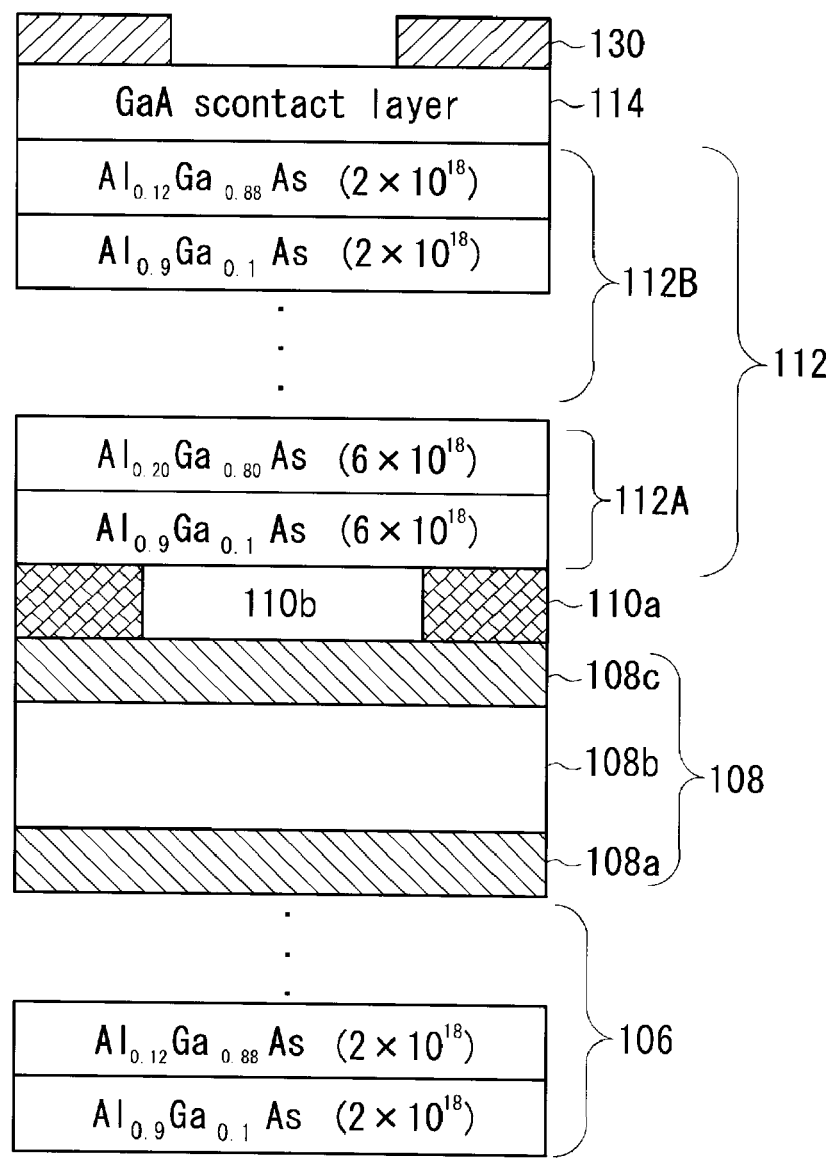
FIG. 3 illustrates a configuration of a lower DBR, an active region, and an upper DBR according to an example of the present invention.

FIG. 3 is a schematic cross sectional view illustrating a detailed configuration of the lower DBR, the active region, and the upper DBR shown in FIG. 2. The lower DBR 106 is made by alternately stacking 40.5 periods of $Al_{0.9}Ga_{0.1}As$ and $Al_{0.12}Ga_{0.88}As$, each having a carrier concentration of $2\times10^{18}$ cm$^{-3}$ and a thickness of ¼ of the wavelength in the medium.

The active region 108 includes an undoped lower $Al_{0.6}Ga_{0.4}As$ spacer layer 108a, an undoped quantum well active layer 108b (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer 108c. The film thickness of the active region 108 is a wavelength in the medium. The gain peak wavelength being determined by the composition of the quantum well active layer 108b is 835 nm, and the band gap energy therein is 1.485 eV.

On the active region 108, the current confining layer 110 made of an AlAs layer having a thickness of, for example, 30 nm is formed. On the periphery of the current confining layer 110, the oxidized region 110a is formed from the side surface the post P as described above, and the conductive region 110b is formed surrounded by the oxidized region 110a. The diameter of the conductive region 110b may be, in a case of a single-mode laser light, less than 5 micrometers, for example.

Provided on the current confining layer 110 are a high concentration DBR 112A having a high impurity concentration that is made by alternately stacking 3 periods of $Al_{0.9}Ga_{0.1}As$ and $Al_{0.20}Ga_{0.80}As$, each having a carrier concentration of $6\times10^{18}$ cm$^{-3}$, such that the thickness of each layer becomes ¼ of the wavelength in the medium; and a DBR 112B formed thereon and made by alternately stacking 27 periods of $Al_{0.9}Ga_{0.1}As$ and $Al_{0.12}Ga_{0.88}As$, each having a carrier concentration of $2\times10^{18}$ cm$^{-3}$, such that the thickness of each layer becomes ¼ of the wavelength in the medium.

Note that the thickness of the $Al_{0.9}Ga_{0.1}As$ layer adjacent to the AlAs layer is adjusted such that the thickness combined the AlAs layer and $Al_{0.9}Ga_{0.1}As$ layer becomes ¼ of the wavelength in the medium. For the uppermost layer of the DBR 112B, a p-type GaAs contact layer 114 having a carrier concentration of $1\times10^{19}$ cm$^{-3}$ and a thickness of about 20 nm is formed.

The high concentration DBR 112A enhances carrier diffusion in a lateral direction especially when driven at a low temperature. When a VCSEL is driven at a low temperature in a range of −40 to −20 degrees centigrade, for example, the diffusion length of carriers becomes shorter depending on the temperature. In other words, as shown in FIG. 3, at a top portion of the post P, carriers injected from the annular electrode 130 may move to the active region due to an electric field. However, if carrier diffusion in a lateral direction is not sufficient, the carrier concentration in the optical axis (center) of the post P is reduced, and the carriers injected through the conductive region 110b in the current confining layer 110 to the active region 108 in the optical axis are reduced. As a result, the profile of the optical output of the optical axis may lower. By forming the high concentration DBR 112A, carrier diffusion in a lateral direction at a low temperature may be enhanced, and the carriers injected through the conductive region 110b to the active region 108 in the optical axis can be increased.

The amount of optical intensity near the active layer is large, and if the impurity concentration near the active region is high, the light absorption becomes greater. The impurity doping concentration of the high concentration DBR 112A is as high as $6\times10^{18}$ cm$^{-3}$; however, the number of the period in the high concentration DBR 112A is three, and thus the light absorption near the active region caused by the high concentration DBR 112A is suppressed. If the number of the period in the high concentration DBR 112A is more than three, the light absorption loss by impurities becomes greater than the improvement in the optical output by the carrier diffusion in lateral direction. Therefore, it is preferable that the number of the period in the high concentration DBR 112A is equal to or less than 3 at maximum.

In addition, the Al-composition of the high refractive index layer ($Al_{0.20}Ga_{0.80}As$ layer having a low Al-composition) in the high concentration DBR 112A is set to 0.20, higher than the Al-composition of the DBR 112B being 0.12. A semiconductor layer having a low Al-composition generally has low band gap energy. If the difference between the band gap energy thereof and the energy of the resonator wavelength becomes smaller, light may be absorbed during a high temperature driving. To prevent the light absorption, the Al-composition of the low-Al semiconductor layer in the high concentration DBR 112A is set to as high as 0.20 to make the difference greater. The optical intensity is large especially at about three periods from the active region, and thus it would be effective to make a large energy difference between the bandgap energy of the low-Al semiconductor layer and the energy of the resonator wavelength at that distance.

Figure 4:
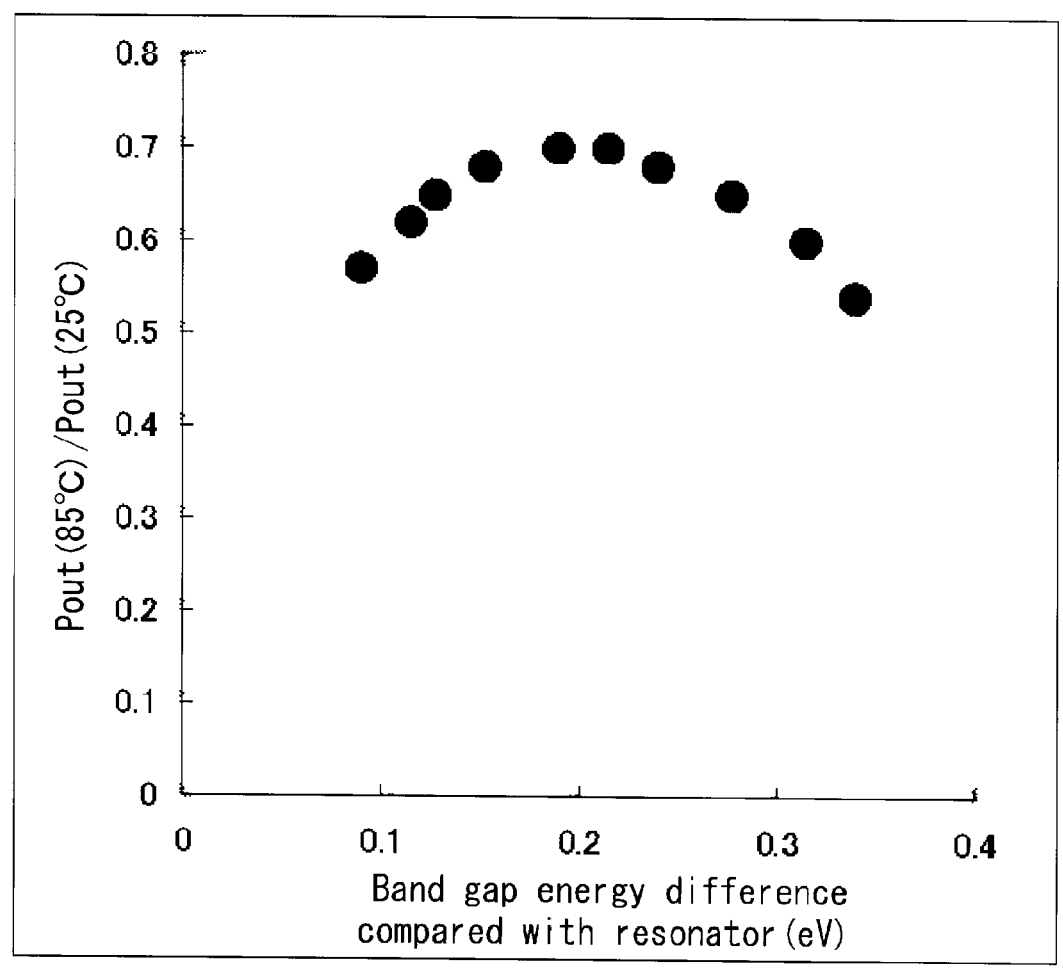
FIG. 4 is a graph illustrating the ratio of the optical output of laser light at a high temperature to the optical output at a room temperature at a constant driving current, and showing the relation of the difference in band gap between the Al-composition and the resonator wavelength to the optical output ratio.

FIG. 4 is a graph illustrating the ratio of the optical output at 85 degrees centigrade to the optical output at a room temperature (25 degrees centigrade), at a constant driving current when the number of the pair in the DBRs is kept constant while the difference between the energy of the resonator wavelength and the band gap energy of the Al-composition of the high refractive index layer in the high concentration DBR 112A. The resonator wavelength is set to slightly higher than the gain peak wavelength of 835 nm, which is determined by the composition of the active layer (energy is 1.485 eV), considering that the gain peak wavelength of the active layer becomes greater at a high temperature. The resonator wavelength is produced by the DBR 106, the active region, the current confining layer, and the DBRs 112A and 112B.

When the Al-composition of the high refractive index layer in the high concentration DBR 112A is 0.20, the band gap energy is about 1.673 eV, and the difference from the energy of the resonator wavelength is about 0.188 eV. In this case, the optical output ratio at 85 degrees centigrade is about 0.68. On the other hand, when the Al-composition of the high refractive index layer is 0.12 as same as that of the DBR 112B, the band gap energy is about 1.574 eV, and the energy difference from the resonator wavelength is about 0.09 eV. In this case, the optical output ratio at 85 degrees centigrade is about 0.60.

As shown in FIG. 4, when the energy difference is less than 0.1 eV, heat generation due to the light absorption by the high refractive index layers that make up the DBRs increases, and the ratio of the optical output at a high temperature decreases down to below 0.6. On the other hand, when the difference in energy is above 0.3 eV, the difference in refractive index between the semiconductor layers that make up the DBRs is reduced, which lowers reflectivity and increases threshold value. Therefore, the optical output in a constant driving current at a high temperature decreases, and the ratio decreases down to below 0.6. In general, if the decrease in the amount of the optical output is equal to or greater than 2 dB, it does not work as a system. Therefore, it is preferable that the difference between the band gap energy of the high refractive index layer and the energy of the resonator wavelength is set to equal to or greater than 0.1 eV and equal to or less than 0.3 eV such that the decrease in the optical output at a high temperature becomes less than 2 dB. By this setting, the decrease in the ratio of the optical output at a high temperature to the optical output at a room temperature can be suppressed when the VCSEL is driven at a constant driving current.

As described above, by providing the high concentration DBR 112A in proximity to the active region 108, current (carrier) diffusion in a lateral direction during a low temperature driving may be enhanced, and current movement to the conductive region 110$b$ in the current confining layer 110 may be enhanced, and the lowering in the optical output during a low temperature driving can be suppressed. On the other hand, by making the band gap energy of the semiconductor layer having a high refractive index in the high concentration DBR 112A greater than the band gap of the resonator wavelength, the light absorption at a high temperature can be suppressed. As a result, a VCSEL in which the lowering in the optical output is reduced in a wide temperature range from at least −40 degrees centigrade to +85 degrees centigrade can be obtained.

Figure 5A:
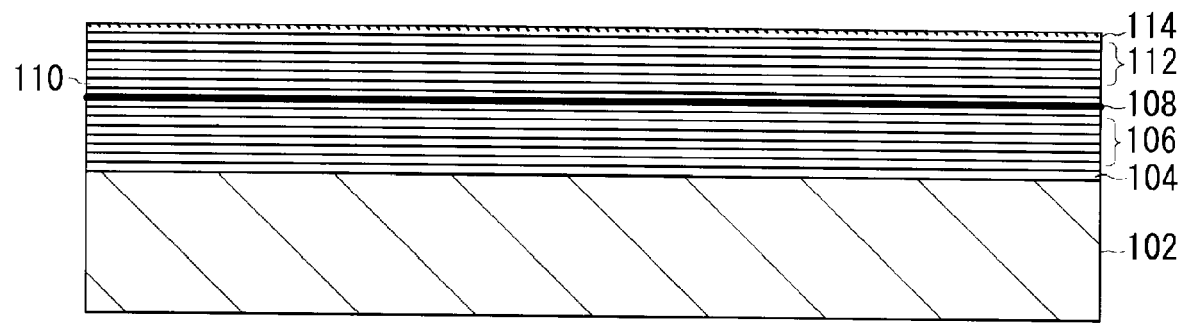
FIGS. 5A to 5C are cross sectional views illustrating a method for fabricating a VCSEL according to an example of the present invention.

Referring now to FIGS. 5A to 7B, a method for fabricating a VCSEL according to an example will be described. As shown in FIG. 5A, by Metal Organic Chemical Vapor Deposition (MOCVD), on an n-type GaAs substrate 102, an n-type GaAs buffer layer 104 having a carrier concentration of $2\times10^{18}$ cm$^{-3}$ and a thickness of about 0.2 micrometers is deposited. On the buffer layer 104, 40.5 periods of $Al_{0.9}Ga_{0.1}As$ and $Al_{0.12}Ga_{0.88}As$, each having a carrier concentration of $2\times10^{18}$ cm$^{-3}$ and a thickness of ¼ of the wavelength in the medium, are alternately stacked to form a lower n-type DBR 106 having a total thickness of the about 4 micrometers. Stacked on the lower DBR 106 is an active region 108 having a thickness being the wavelength in the medium and made of an undoped lower $Al_{0.6}Ga_{0.4}As$ spacer layer, an undoped quantum well active layer (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer.

On the active region 108, an AlAs layer 110 for enabling current confining by oxidation is stacked. On the AlAs layer 110, 3 periods of p-type $Al_{0.9}Ga_{0.1}As$ and $Al_{0.20}Ga_{0.80}As$, each having a carrier concentration of $6\times10^{18}$ cm$^{-3}$, such that the thickness of each layer becomes ¼ of the wavelength in the medium are stacked, and further thereon, 27 periods of p-type $Al_{0.9}Ga_{0.1}As$ and $Al_{0.12}Ga_{0.88}As$, each having a carrier concentration of $2\times10^{18}$ cm$^{-3}$, such that the thickness of each layer becomes ¼ of the wavelength in the medium are alternately stacked. The p-type upper DBR 112 made of the two semiconductor mirror layers as described above has a total thickness of about 2 micrometers. Finally, a p-type GaAs contact layer 114 having a carrier concentration of $1\times10^{19}$ cm$^{-3}$ and having a thickness of about 20 nm is stacked as the uppermost layer.

Although not described in detail, to reduce electrical resistance of the DBR, a region having a thickness of about 20 nm in which the Al-composition varies stepwise from 90% to 20% or to 12% may be provided on the interface between $Al_{0.9}Ga_{0.1}As$ and $Al_{0.20}Ga_{0.80}As$ or $Al_{0.12}Ga_{0.88}As$. In the example, deposition to form the layers is continuously performed by using trimethyl gallium, trimethyl aluminum, and arsine as source gases, which are changed sequentially, and using cyclopentadinium magnesium, carbon, as a p-type dopant, and silane as an n-type dopant, with the substrate temperature being kept at 750 degrees centigrade, without breaking vacuum.

Figure 5B:
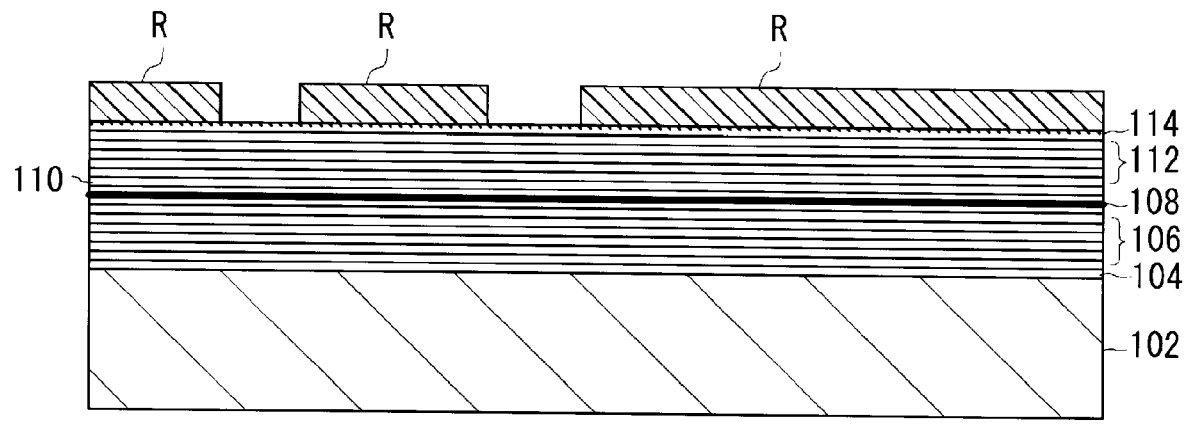
Figure 5C:
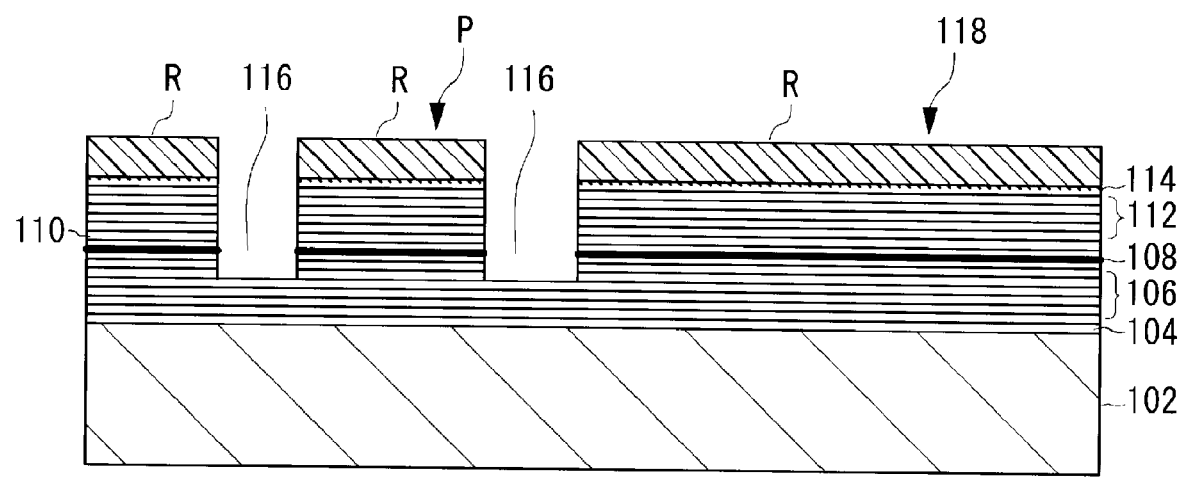

Next, as shown in FIG. 5B, by using a photolithography process, a resist mask R is formed on the crystal growth layer. Then, a reactive ion etching is performed by using boron trichloride as an etching gas to form an annular groove 116 to a middle portion of the lower DBR 106, as shown in FIG. 5C. By this process, plural cylindrical semiconductor posts P having a diameter of about 10 to 30 micrometers or plural rectangular prism shaped semiconductor posts P and a pad formation region 118 surrounding the post P may be formed.

Figure 6A:
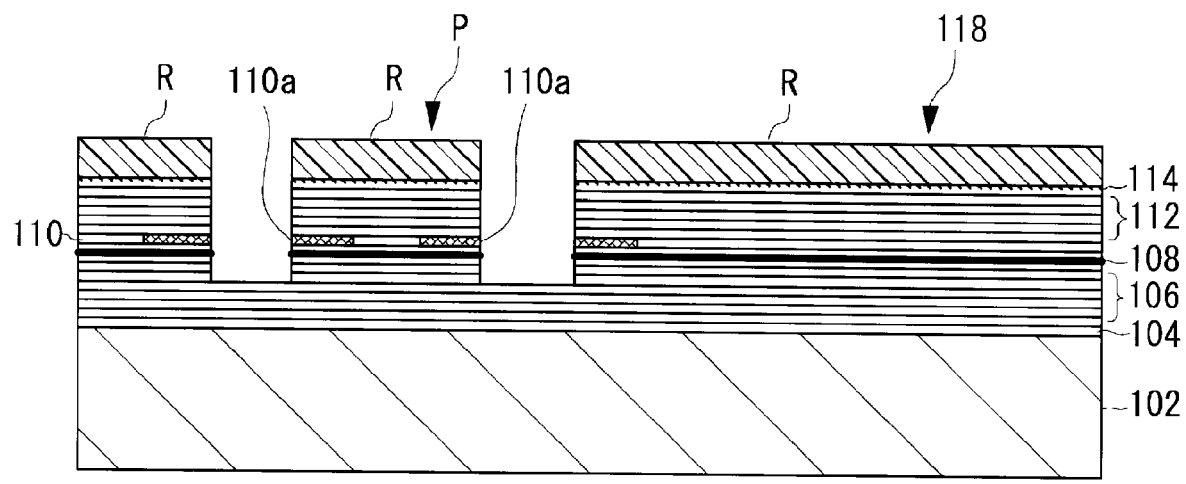
FIGS. 6A to 6C are cross sectional views illustrating a method for fabricating a VCSEL according to an example of the present invention.

Then, as shown in FIG. 6A, the substrate is exposed to a vapor atmosphere, for example, at 340 degrees centigrade for a certain amount of time to perform an oxidation process. The AlAs layer that makes up the current confining layer 110 has a significantly higher oxidation speed than those of the $Al_{0.9}Ga_{0.1}As$ layer and the $Al_{0.20}Ga_{0.80}As$ layer that also make up a portion of the current confining layer 110, and is oxidized from a side surface of the post P to form an oxidized region 110$a$, reflecting the shape of the post. A non-oxidized region (conductive region) that is left unoxidized becomes a current injecting region or conductive region.

Figure 6B:
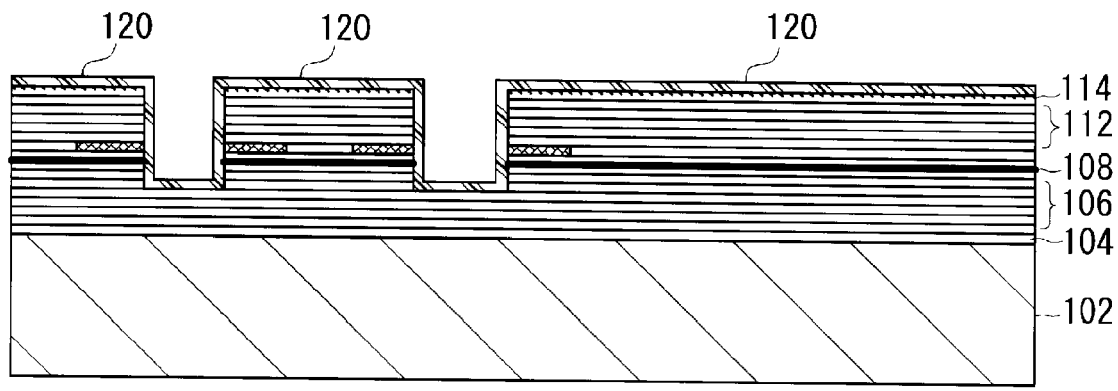
Figure 6C:
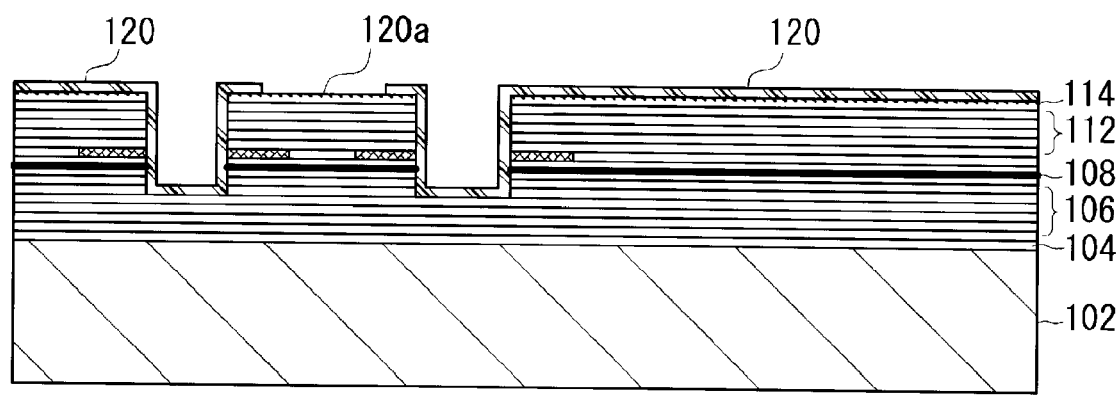

Next, after the resist R is removed, as shown in FIG. 6B, by using a plasma CVD apparatus, an interlayer insulating film 120 made of SiN or the like is deposited on the entire surface of the substrate including the groove 116. After that, as shown in FIG. 6C, the interlayer insulating film 120 is etched by using a general photolithography process and a dry etching to remove a top portion of the interlayer insulating film 120 of the post P and to form a round-shaped contact hole 120$a$ therein. Alternatively, the contact hole 120$a$ may be made in a ring shape, and the contact layer of the upper DBR that becomes an emitting region may be protected with SiN, as shown in FIG. 2.

Figure 7A:
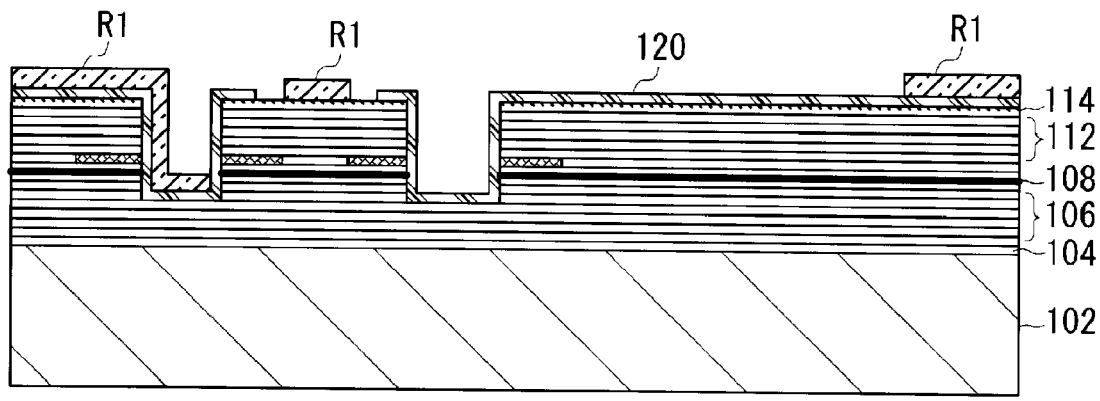
FIGS. 7A and 7B are cross sectional views illustrating a method for fabricating a VCSEL according to an example of the present invention.
Figure 7B:
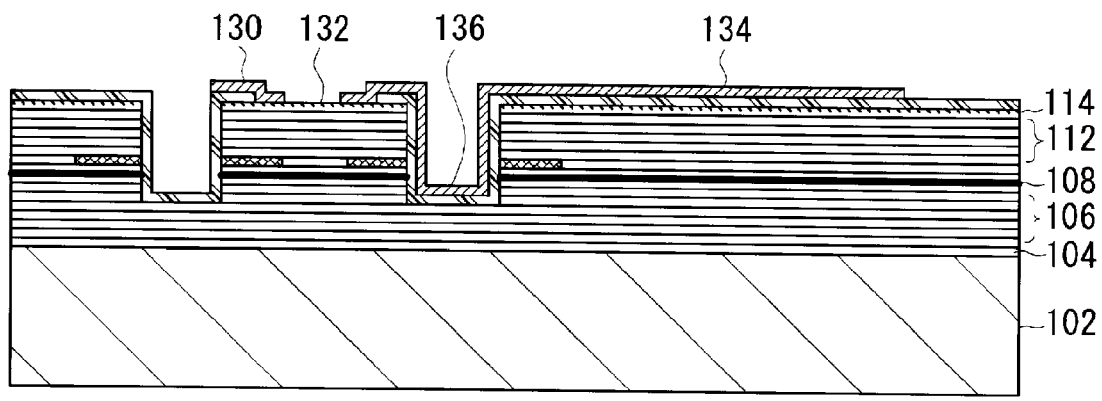

After that, as shown in FIG. 7A, a resist pattern R1 is formed in a center portion of an upper portion of the post P by using a photolithography process. From above the resist pattern R1, by using an EB deposition apparatus, Au having a thickness of 100 to 1000 nm, preferably 600 nm, is deposited as a p-side electrode material. When the resist pattern R1 is peeled off, the Au on the resist pattern R1 is removed as shown in FIG. 7B, and an upper electrode 130, an electrode pad 134, and an extraction wiring 136 are formed. From the portion without the p-side electrode, that is, an opening 132 at a center portion of the post, laser light is to be emitted. Although not described in detail herein, a metal opening portion formed on the post P may be formed prior to the formation of the post.

On the back surface of the substrate, Au/Ge is deposited as an n-electrode. After that, annealing is performed with an annealing temperature at temperatures in a range of 250 to 500 degrees centigrade, and preferably at temperatures in a range of 300 to 400 degrees centigrade, for 10 minutes. The annealing duration is not necessarily limited to 10 minutes, and may be in a range of 0 to 30 minutes. Also, the deposition method is not necessarily limited to the EB deposition, and a resistance heating method, sputtering method, magnetron sputtering method, or CVD method may be used. In addition, the annealing method is not necessarily limited to thermal annealing using a general electric furnace. A similar effect can be obtained by flash annealing or laser annealing using infrared radiation, annealing by high frequency heating, annealing by electron beam, or annealing by lamp heating.

While the exemplary embodiments of the present invention have been described in detail, the invention is not limited to these specific embodiments, and various modifications and changes can be made without departing from the inventive scope that is defined by the following claims. For example, in the examples described above, AlGaAs is used as a compound semiconductor layer; however, other III-V group semiconductor can also be used. In addition, the Al-composition or dopant concentration may be changed depending on designs as appropriate. Furthermore, although the n-side electrode is formed on the back surface of the substrate in the examples; alternatively, an n-side electrode electrically coupled to an n-type semiconductor layer stacked on the substrate may be formed. In this case, the substrate may be electrically insulating, and laser light may be emitted from the substrate side. In addition, on the substrate, plural light emitting portions (posts) may be monolithically formed.

Figure 8A:
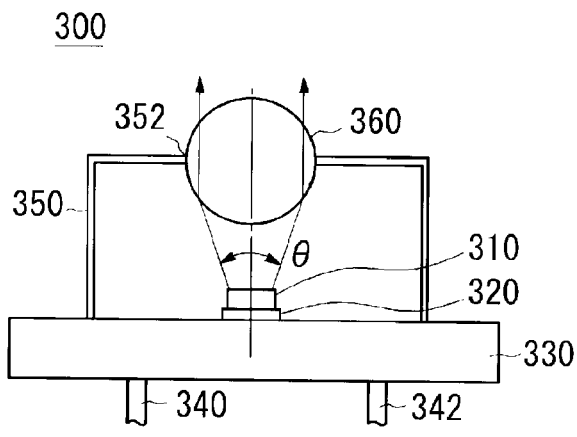
FIGS. 8A and 8B are schematic cross sectional views illustrating a configuration of a module in which an optical component and a VCSEL according to an example are mounted.

Referring to the accompanying drawings, a module, an optical transmission device, a free space optical communication system, or the like that uses a VCSEL according to an example of the invention will be now described. FIG. 8A is a cross sectional view illustrating a configuration example of a package (module) in which a VCSEL is mounted. In a package 300, a chip 310 in which a VCSEL is formed is fixed on a disc-shaped metal stem 330 through a conductive adhesive 320. Conductive leads 340 and 342 are inserted into through holes (not shown) formed in the stem 330. One lead 340 is electrically coupled to an n-side electrode of the VCSEL, and the other lead 342 is electrically coupled to a p-side electrode.

Above the stem 330 that includes the chip 310, a cylindrical hollow cap 350 is fixed, and a ball lens 360 is fixed in an opening 352 in a center portion of the cap 350. The optical axis of the ball lens 360 is positioned to match an approximate center of the chip 310. When a forward voltage is applied between the leads 340 and 342, laser light is emitted perpendicularly from the chip 310. The distance between the chip 310 and the ball lens 360 is adjusted such that the ball lens 360 is contained within the divergence angle θ of the laser light from the chip 310. In the module, a light sensing element or a thermal sensor may be contained to monitor the emitting status of the VCSEL.

Figure 8B:
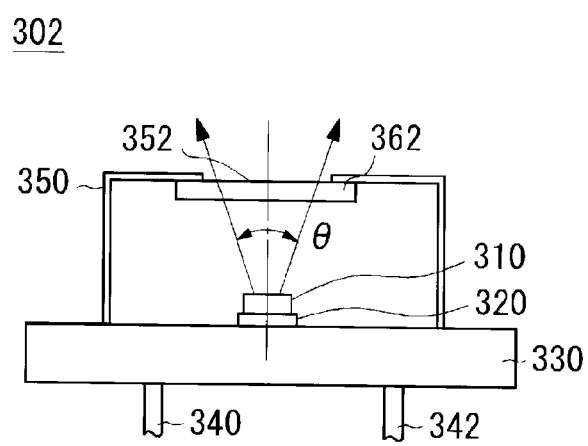

FIG. 8B illustrates a configuration example of another package. In a package 302 shown in FIG. 8B, instead of using the ball lens 360, a flat-plate glass 362 is fixed in the opening 352 in a center portion of the cap 350. The center of the flat-plate glass 362 is positioned to match an approximate center of the chip 310. The distance between the chip 310 and the flat-plate glass 362 is adjusted such that the opening diameter of the flat-plate glass 362 is equal to or greater than the divergence angle θ of the laser light from the chip 310.

Figure 9:
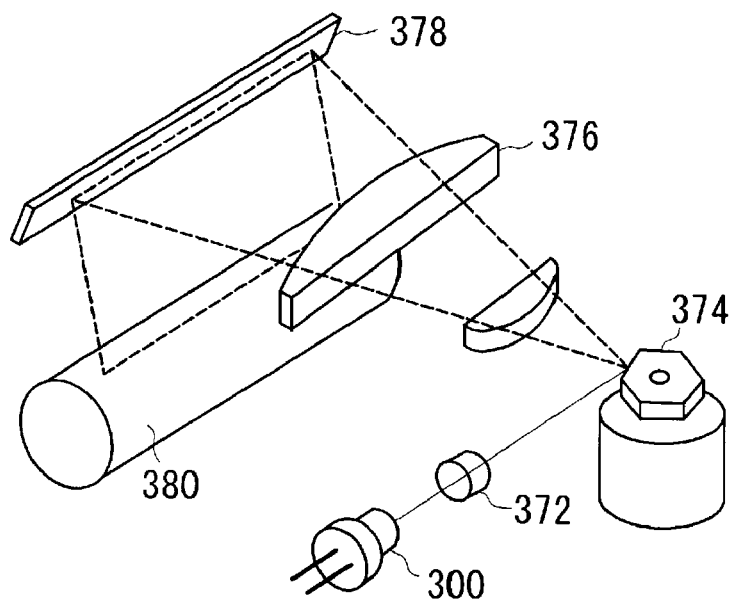
FIG. 9 illustrates an example of a configuration of a light source device in which a VCSEL is used.

FIG. 9 illustrates an example in which a VCSEL is used as a light source. A light irradiation device 370 includes the package 300 in which a VCSEL is mounted as shown in FIG. 8A or FIG. 8B, a collimator lens 372 that injects multi-beam laser light from the package 300, a polygon mirror 374 that rotates at a certain speed and reflects the light rays from the collimator lens 372 with a certain divergence angle, an f0 lens 376 that receives laser light from the polygon mirror 374 and projects the laser light on a reflective mirror 378, a line-shaped reflective mirror 378, and a light sensitive drum 380 that forms a latent image based on the reflected light from the reflective mirror 378. As such, the VCSEL can be used for a light source for an optical data processing apparatus such as a copying machine or a printer that is equipped with an optical system that collects the laser light from the VCSEL onto a light sensitive drum, and a mechanism that scans the collected laser light on the light sensitive drum.

Figure 10:
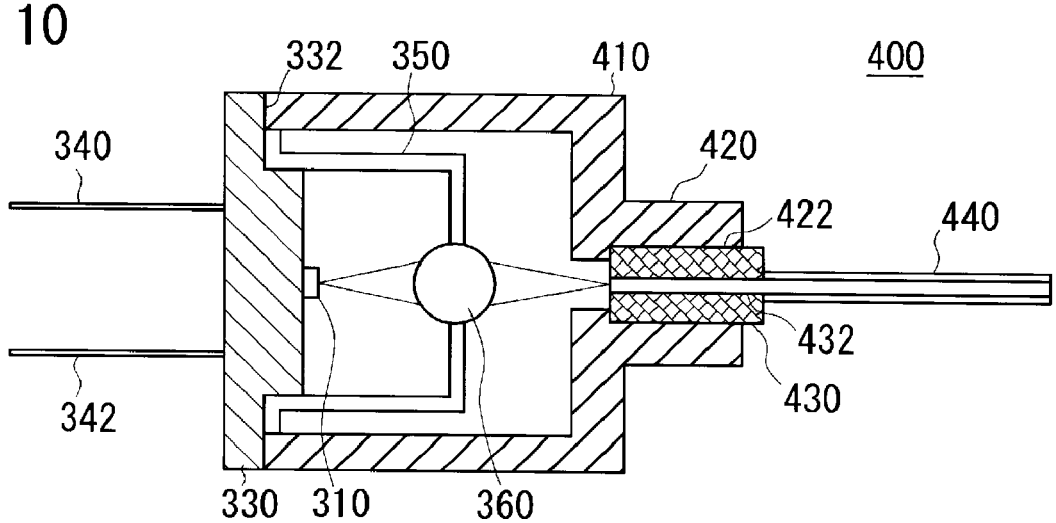
FIG. 10 is a schematic cross sectional view illustrating a configuration example of an optical transmission device in which the module shown in FIG. 8A is used.

FIG. 10 is a cross sectional view illustrating a configuration example in which the module shown in FIG. 8A is applied to an optical transmission device. An optical transmission device 400 includes a cylindrical housing 410 fixed to the stem 330, a sleeve 420 formed integral with the housing 410 on an edge surface thereof, a ferrule 430 held in an opening 422 of the sleeve 420, and an optical fiber 440 held by the ferrule 430. In a flange 332 formed in a direction of the circumference of the stem 330, an edge portion of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. Although the ball lens 360 is used in the example described above, other lens such as a biconvex lens or plane-convex lens may be used. In addition, the optical transmission device 400 may include a driving circuit for applying an electrical signal to the leads 340 and 342. Furthermore, the optical transmission device 400 may have a receiving function for receiving an optical signal via the optical fiber 440.

Figure 11:
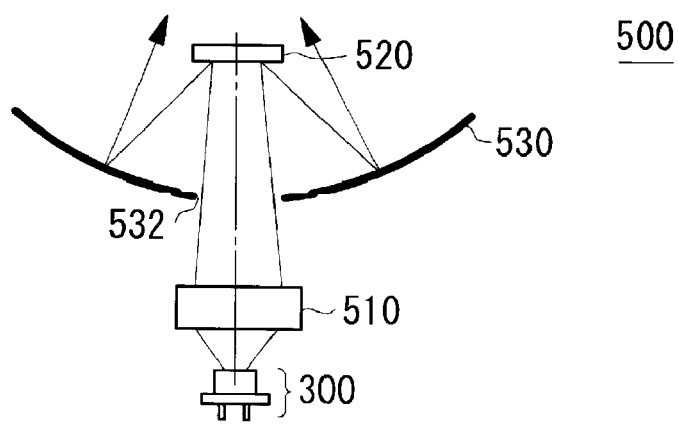
FIG. 11 illustrates a configuration example in which the module shown in FIG. 8A

FIG. 11 illustrates a configuration example in which the module shown in FIG. 8A or FIG. 8B is used in a free space optical communication system. A free space optical communication system 500 includes the package 300, a condensing lens 510, a diffusing plate 520, and a reflective mirror 530. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission.

Figure 12A:
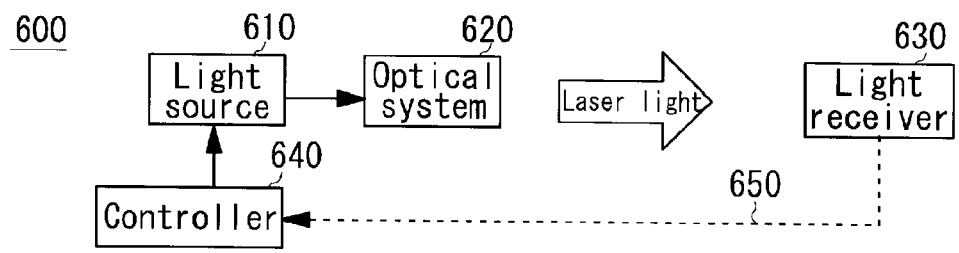
FIG. 12A is a block diagram illustrating a configuration example of an optical transmission system.

FIG. 12A illustrates an example of a configuration of an optical transmission system in which a VCSEL is used as a light source. An optical transmission system 600 includes a light source 610 that contains a chip 310 in which a VCSEL is formed, an optical system 620, for example, for concentrating laser light emitted from the light source 610, a light receiver 630 for receiving laser optical outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by means of an optical fiber or a reflective mirror for free space transmission. The light receiver 630 detects received light by a photo-detector, for example. The light receiver 630 is capable of controlling operations (for example, the start timing of optical transmission) of the controller 640, by a control signal 650.

Figure 12B:
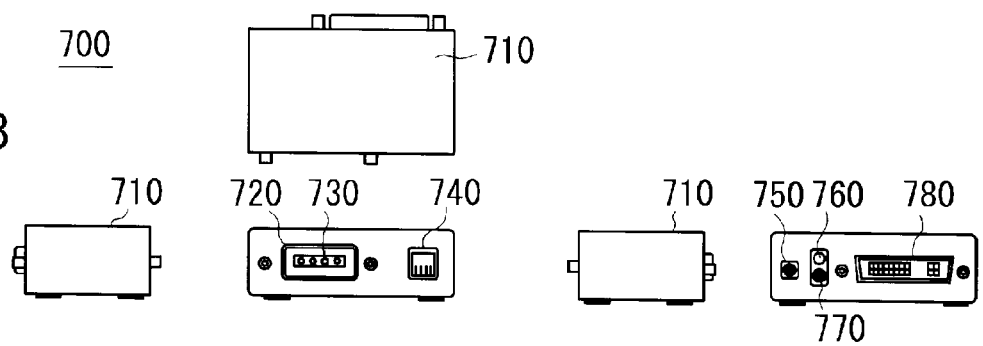
FIG. 12B illustrates an outer configuration example of an optical transmission device.

FIG. 12B illustrates a configuration example of an optical transmission device used for an optical transmission system. An optical transmission device 700 includes a case 710, an optical signal transmitting/receiving connector 720, a light emitting/light receiving element 730, an electrical signal cable connector 740, a power input 750, an LED 760 for indicating normal operation, an LED 770 for indicating an abnormality, and a DVI connector 780, and includes a transmitting circuit board/receiving circuit board mounted inside.

Figure 13:
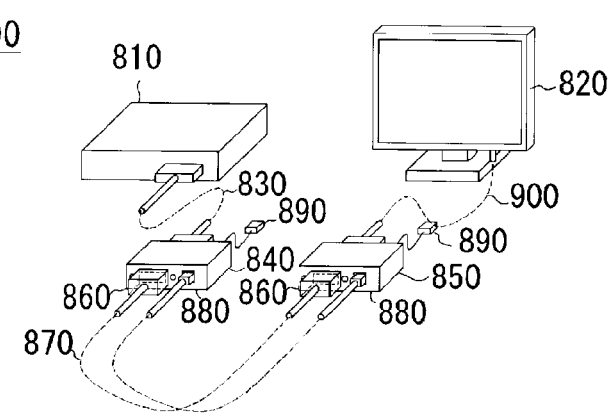
FIG. 13 illustrates a video transmission system in which the optical transmission device shown in FIG. 12B is used.

FIG. 13 illustrates a video transmission system in which the optical transmission device 700 is used. A video transmission system 800 uses the optical transmission device shown in FIG. 12B for transmitting a video signal generated at a video signal generator 810 to an image display 820 such as a liquid crystal display. More specifically, the video transmission system 800 includes the video signal generator 810, the image display 820, an electrical cable 830 for DVI, a transmitting module 840, a receiving module 850, connectors 860 for a video signal transmission optical signal, an optical fiber 870, electrical cable connectors 880 for a control signal, power adapters 890, and an electrical cable 900 for DVI.

A VCSEL according to the present invention can be used in fields such as optical data processing or optical high-speed data communication.

The foregoing description of the examples has been provided for the purposes of illustration and description, and it is not intended to limit the scope of the invention. It should be understood that the invention may be implemented by other methods within the scope of the invention that satisfies requirements of a configuration of the present invention.

What is claimed is:

1. A Vertical-Cavity Surface-Emitting Laser (VCSEL) comprising:
    a substrate;
    a first semiconductor multilayer film reflective mirror of a first conductivity type formed on the substrate;
    an active region formed on the first semiconductor multilayer film reflective mirror;
    a current confining layer of a second conductivity type formed on the active region;
    a second semiconductor multilayer film reflective mirror of the second conductivity type formed on the current confining layer; and
    a third semiconductor multilayer film reflective mirror of the second conductivity type formed on the second semiconductor multilayer film reflective mirror,
    the first, second, and third semiconductor multilayer film reflective mirrors each comprising a pair of a high refractive index layer and a low refractive index layer,
    the impurity concentration of the second semiconductor multilayer film reflective mirror being higher than the impurity concentration of the third semiconductor multilayer film reflective mirror, and
    the band gap energy of the high refractive index layer in the second semiconductor multilayer film reflective mirror being greater than the energy of the wavelength of a resonator formed of the first semiconductor multilayer film reflective mirror, the active region, the current confining layer, the second semiconductor multilayer film reflective mirror, and the third semiconductor multilayer film reflective mirror.

2. The VCSEL according to claim 1, wherein the high refractive index layer is a semiconductor layer having a relatively low Al-composition, the low refractive index layer is a semiconductor layer having a relatively high Al-composition, and the Al-composition of the semiconductor layer having a relatively low Al-composition in the second semiconductor multilayer film reflective mirror is the greater than the energy of the wavelength of the resonator.

3. The VCSEL according to claim 1, wherein the number of the pair in the second semiconductor multilayer film reflective mirror is between 1 and 3.

4. The VCSEL according to claim 1, wherein the first semiconductor multilayer film reflective mirror comprises a pair of an $Al_{x1}Ga_{1-x1}As$ semiconductor layer and an $Al_{y1}Ga_{1-y1}As$ semiconductor layer (X1>Y1, 0<X1<1, 0<Y1<1), the second semiconductor multilayer film reflective mirror comprises a pair of an $Al_{x2}Ga_{1-x2}As$ semiconductor layer and an $Al_{y2}Ga_{1-y2}As$ semiconductor layer (X2>Y2, 0<X2<1, 0<Y2<1), and the third semiconductor multilayer film reflective mirror comprises a pair of an Alx3Ga1-x3As semiconductor layer and an $Al_{y3}Ga_{1-y3}As$ semiconductor layer (X3>Y3, 0<X3<1, 0<Y3<1), and wherein Y2>Y1 and Y2>Y3.

5. The VCSEL according to claim 1, wherein the difference between the band gap energy of the high refractive index layer in the second semiconductor multilayer film reflective mirror and the energy of the wavelength of the resonator is equal to or greater than 0.1 eV and equal to or less than 0.3 eV.

6. The VCSEL according to claim 1, further comprising a mesa starting from the third semiconductor multilayer film reflective mirror to at least the active region, the current confining layer comprising an oxidized region a portion thereof being oxidized from a side surface of the mesa.

7. A Vertical-Cavity Surface-Emitting Laser (VCSEL) comprising:
    a substrate;
    a first semiconductor multilayer film reflective mirror of a first conductivity type formed on the substrate;
    an active region formed on the first semiconductor multilayer film reflective mirror;
    a current confining layer of a second conductivity type formed on the active region;
    a second semiconductor multilayer film reflective mirror of a second conductivity type formed on the current confining layer; and
    a third semiconductor multilayer film reflective mirror of the second conductivity type formed on the second semiconductor multilayer film reflective mirror,
    the first, second, and third semiconductor multilayer film reflective mirrors comprising a pair of an Alx1Ga1-x1As semiconductor layer and an $Al_{y1}Ga_{1-y1}As$ semiconductor layer (X1>Y1), a pair of an $Al_{x2}Ga_{1-x2}As$ semiconductor layer and an $Al_{y2}Ga_{1-y2}As$ semiconductor layer (X2>Y2), and a pair of an $Al_{x3}Ga_{1-x3}As$ semiconductor layer and an $Al_{y3}Ga_{1-y3}As$ semiconductor layer (X3>Y3), respectively,
    the Al-composition Y2 in the second semiconductor multilayer film reflective mirror being higher than the Al-composition Y1 in the first semiconductor multilayer film reflective mirror, and higher than the Al-composition Y3 in the third semiconductor multilayer film reflective mirror,
    the band gap energy of the $Al_{y2}Ga_{1-y2}As$ semiconductor layer in the second semiconductor multilayer film reflective mirror being greater than the energy of the wavelength of a resonator formed of the first semiconductor multilayer film reflective mirror, the active region, the current confining layer, the second semiconductor multilayer film reflective mirror, and the third semiconductor multilayer film reflective mirror, and the impurity concentration of the second semiconductor multilayer film reflective mirror being higher than the impurity concentration of the third semiconductor multilayer film reflective mirror.

8. The VCSEL according to claim 7, wherein the difference between the band gap energy of the $Al_{y2}Ga_{1-y2}As$ semiconductor layer in the second semiconductor multilayer film reflective mirror and the energy of the wavelength of the resonator is equal to or greater than 0.1 eV and equal to or less than 0.3 eV.

9. A module comprising:
a VCSEL; and
an optical material,
the VCSEL comprising:
a substrate;
a first semiconductor multilayer film reflective mirror of a first conductivity type formed on the substrate;
an active region formed on the first semiconductor multilayer film reflective mirror;
a current confining layer of a second conductivity type formed on the active region;
a second semiconductor multilayer film reflective mirror of the second conductivity type formed on the current confining layer; and
a third semiconductor multilayer film reflective mirror of the second conductivity type formed on the second semiconductor multilayer film reflective mirror, the first, second, and third semiconductor multilayer film reflective mirrors each comprising a pair of a high refractive index layer and a low refractive index layer, the impurity concentration of the second semiconductor multilayer film reflective mirror being higher than the impurity concentration of the third semiconductor multilayer film reflective mirror, and the band gap energy of the high refractive index layer in the second semiconductor multilayer film reflective mirror being greater than the energy of the wavelength of a resonator formed of the first semiconductor multilayer film reflective mirror, the active region, the current confining layer, the second semiconductor multilayer film reflective mirror, and the third semiconductor multilayer film reflective mirror.

10. An optical transmission device comprising the module according to claim 9 and a transmission unit for transmitting laser light emitted from the module through an optical unit.

11. A free space optical communication device comprising the module according to claim 9 and a transmission unit for performing free space optical communication of light emitted from the module.

12. An optical transmission system comprising the module according to claim 9 and a transmission unit for transmitting laser light emitted from the module.

13. A free space optical communication system comprising the module according to claim 9 and a transmission unit for performing free space optical communication of light emitted from the module.

* * * * *